(12) United States Patent
Hung et al.

(10) Patent No.: US 11,302,574 B2
(45) Date of Patent: Apr. 12, 2022

(54) METHOD OF MANUFACTURING A DISPLAY DEVICE

(71) Applicant: ASUSTeK COMPUTER INC., Taipei (TW)

(72) Inventors: Wen-Chang Hung, Taipei (TW); Xian Zhong, Taipei (TW)

(73) Assignee: ASUSTEK COMPUTER INC., Taipei (TW)

( * ) Notice: Subject to any disclaimer, the term of this patent is extended or adjusted under 35 U.S.C. 154(b) by 79 days.

(21) Appl. No.: 16/713,076

(22) Filed: Dec. 13, 2019

(65) Prior Publication Data

US 2020/0203223 A1  Jun. 25, 2020

(30) Foreign Application Priority Data

Dec. 20, 2018 (TW) .................... 107146233

(51) Int. Cl.
*H01L 21/786* (2006.01)
*H01L 27/12* (2006.01)
*H01L 27/32* (2006.01)
*H01L 21/768* (2006.01)

(52) U.S. Cl.
CPC ...... *H01L 21/76877* (2013.01); *H01L 27/124* (2013.01); *H01L 27/1262* (2013.01); *H01L 27/3251* (2013.01)

(58) Field of Classification Search
CPC ............. H01L 21/76877; H01L 27/124; H01L 27/1262; H01L 27/3276; H01L 51/5284; H01L 27/3251
See application file for complete search history.

(56) References Cited

U.S. PATENT DOCUMENTS

| 8,288,778 B2* | 10/2012 | Nakatani | H01L 27/3274 257/81 |
| --- | --- | --- | --- |
| 2004/0212979 A1* | 10/2004 | Chen | G06F 1/1637 362/601 |
| 2012/0001173 A1* | 1/2012 | Suzuki | H01L 29/66757 257/43 |
| 2013/0105773 A1* | 5/2013 | Kim | H01L 27/3251 257/40 |
| 2014/0049522 A1* | 2/2014 | Mathew | H01L 51/5281 345/204 |
| 2015/0123098 A1* | 5/2015 | Kang | H01L 51/5253 257/40 |
| 2019/0088786 A1* | 3/2019 | Li | H01L 29/41733 |
| 2019/0377438 A1* | 12/2019 | Kim | G06F 3/0443 |
| 2021/0057398 A1* | 2/2021 | Chen | H01L 23/481 |
| 2021/0233984 A1* | 7/2021 | Wang | H01L 27/3227 |
| 2021/0408067 A1* | 12/2021 | Xu | H01L 27/1248 |
| 2021/0408190 A1* | 12/2021 | Yang | H01L 27/3262 |

FOREIGN PATENT DOCUMENTS

| CN | 106773415 A | 5/2017 |
| --- | --- | --- |
| CN | 108155220 A | 6/2018 |
| TW | M466355 U | 11/2013 |

* cited by examiner

*Primary Examiner* — Mohsen Ahmadi
(74) *Attorney, Agent, or Firm* — McClure, Qualey & Rodack, LLP

(57) ABSTRACT

A method of manufacturing a display device comprises: forming a thin film transistor array on a substrate, wherein the substrate has a via which enable two opposite sides of the substrate to be communicated with each other; and filling the via with a conductive filler after the thin film transistor array is formed, so that the conductive filler is electrically connected with the thin film transistor array.

8 Claims, 8 Drawing Sheets

METHOD OF MANUFACTURING A DISPLAY DEVICE

CROSS-REFERENCE TO RELATED APPLICATION

This application claims the priority benefit of Taiwan Application Serial No. 107146233, filed on Dec. 20, 2018. The entirety of the above-mentioned patent application is hereby incorporated by reference herein and made a part of specification.

BACKGROUND OF THE INVENTION

Field of the Invention

The invention relates to a method of manufacturing a display device.

Description of the Related Art

In recent years, a display device develops to narrow frame design. The narrow frame design not only reduces an overall volume of the display device but also increases a screen occupation ratio. Thus, how to provide a method of manufacturing a display device of a narrow frame is one of directions urgently needing efforts at present.

BRIEF SUMMARY OF THE INVENTION

On that account, the invention is directed to a method of manufacturing a display device.

In order to achieve above objectives, according to an embodiment of the disclosure, a method of manufacturing a display device comprises: forming a thin film transistor array on a substrate, wherein the substrate has a via, and the via enables two opposite sides of the substrate to be communicated with each other; and filling the via with a conductive filler after the thin film transistor array is formed, so that the conductive filler is electrically connected with the thin film transistor array.

In summary, the method of manufacturing a display device of the disclosure firstly performs deposition of a thin film transistor, then fills the via by low temperature slurry filling. And the problem that via filler permeates into the thin film transistor in the prior art is solved.

The disclosure is described in detail through embodiments, and a further explanation of the technical solutions of the disclosure will be provided.

BRIEF DESCRIPTION OF THE DRAWINGS

To make the foregoing and other objectives, features, advantages, and embodiments of the disclosure more comprehensible, descriptions of the accompanying drawings are as follows.

DETAILED DESCRIPTION OF THE EMBODIMENTS

Figure 1:
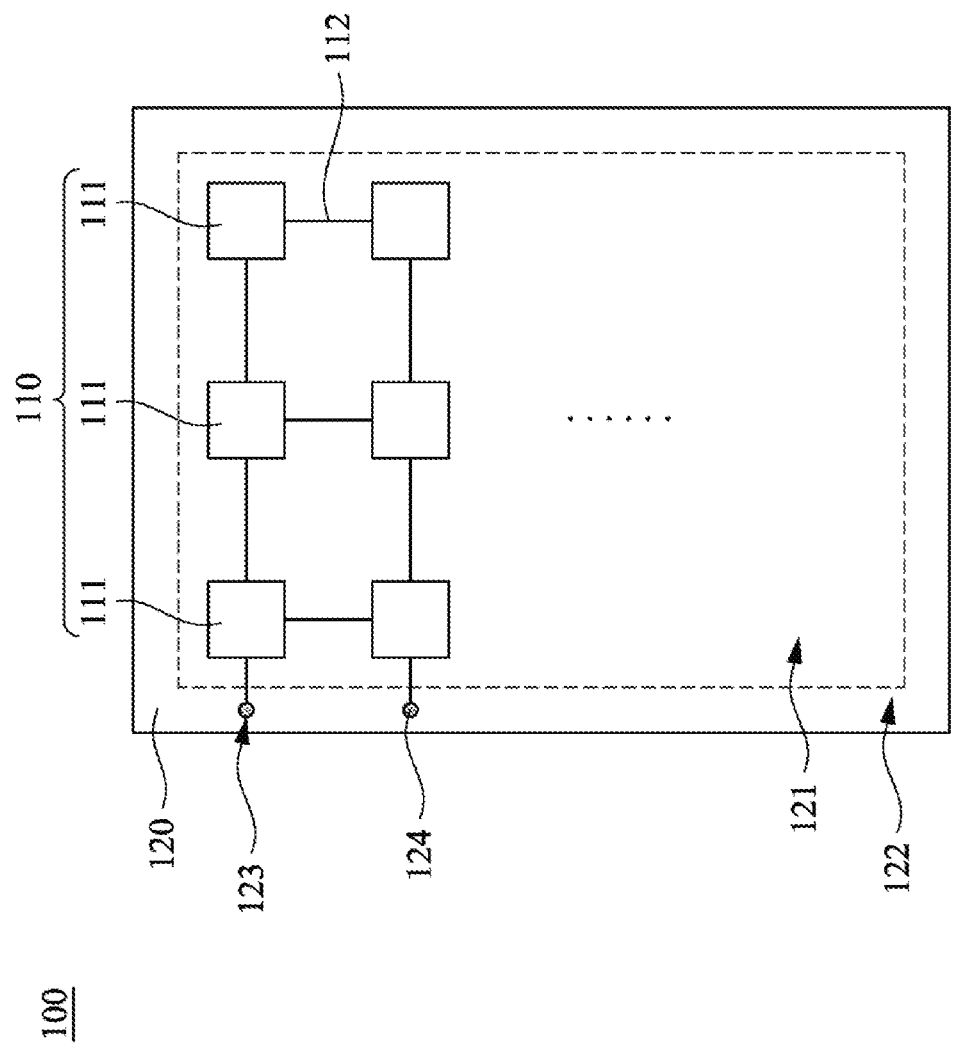
FIG. 1 a top view of a display device according to an embodiment of the disclosure.

To make the description of the disclosure more thorough and complete, reference may be made to the accompanying drawings and the various embodiments described below. Elements in the drawings are not drawn to scale and are provided merely to illustrate the disclosure. Numerous practical details are described below to provide a thorough understanding of the disclosure. However, it will be understood by those of ordinary skill in the relevant art that the disclosure may be practiced without one or more of the practical details, and therefore, such details are not intended to limit the disclosure.

Figure 2:
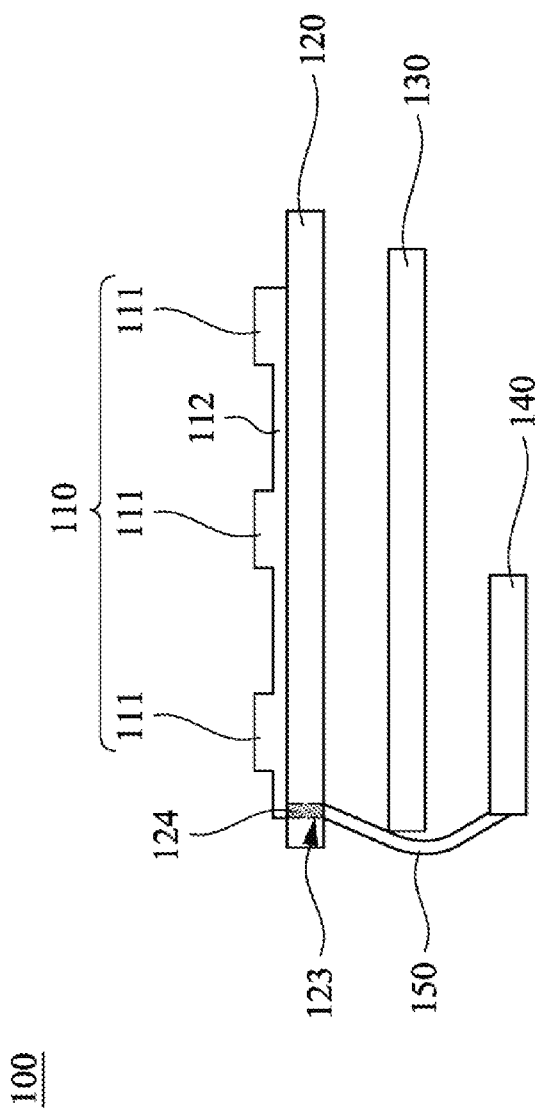
FIG. 2 is a side view of the display device as shown in FIG. 1.
Figure 3:
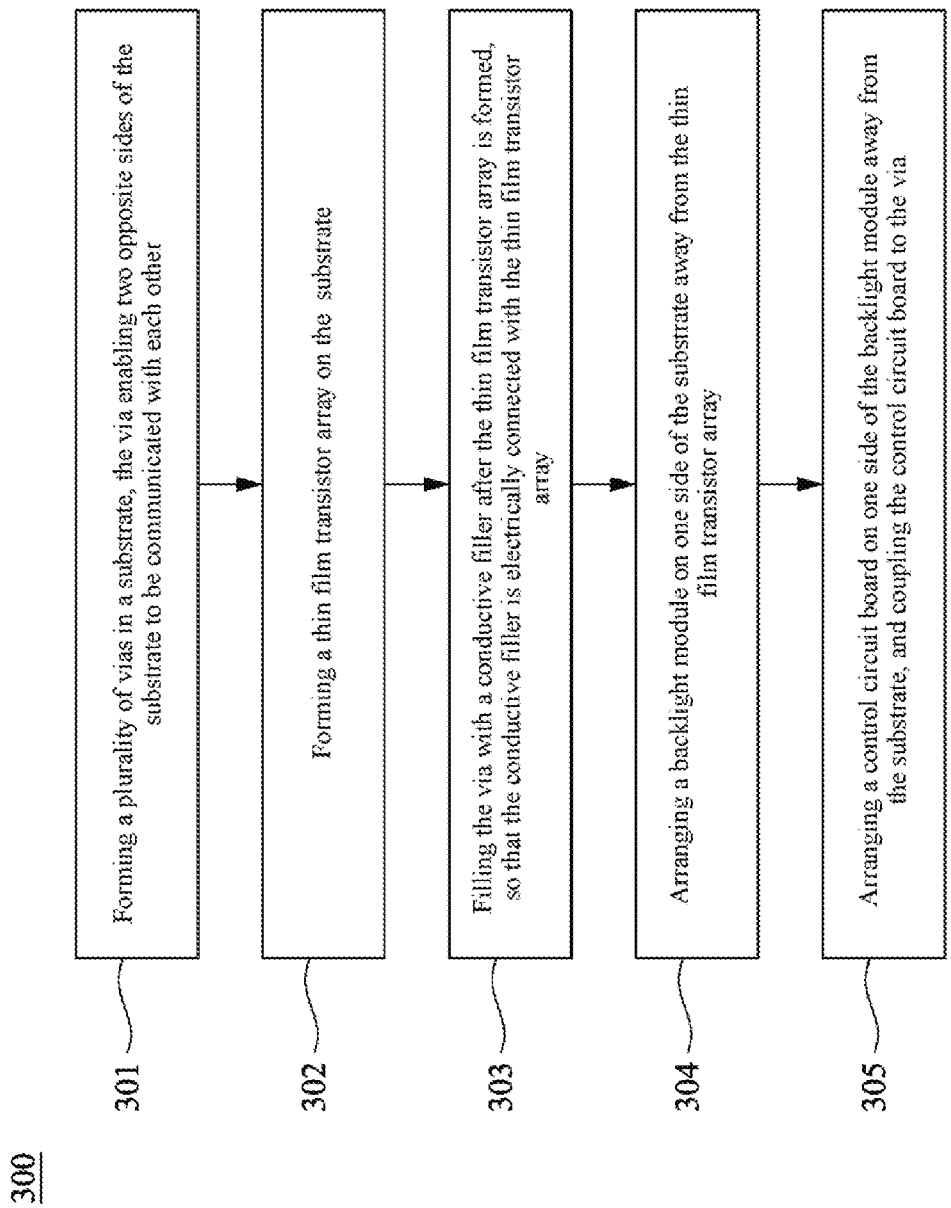
FIG. 3 a flow chart of a method of manufacturing a display device according to an embodiment of the disclosure.

Referring to FIG. 1 and FIG. 2, FIG. 1 a top view of a display device 100 according to an embodiment of the disclosure, and FIG. 2 is a side view of the display device 100 as shown in FIG. 1. The display device 100 is a non-self-luminous display device, such as a liquid crystal display (LCD). As shown in FIG. 2, the display device 100 comprises a thin film transistor array 110, a substrate 120, a backlight module 130, a control circuit board 140 and a flexible printed circuit 150. The thin film transistor array 110 is arranged on the substrate 120, and comprises a plurality of display units 111 and a control circuit 112 connected between the display units 111. The substrate 120 has a plurality of first vias 123 which enable two opposite sides of the substrate 120 to be communicated with each other. The first via 123 is filled with a conductive filler 124 which is electrically connected with the control circuit 112. The backlight module 130 is located on one side of the substrate 120 away from the thin film transistor array 110, and the control circuit board 140 is located below the backlight module 130. The control circuit board 140 is coupled to the first via 123 through the flexible printed circuit 150 wound from a side edge of the backlight module 130. A method of manufacturing a display device 300 used for manufacturing the display device 100 is introduced in detail with reference to FIG. 3 all together, and comprises steps 301-305.

In the step 301, a plurality of first vias 123 (shown with imaginary lines in FIG. 2) are formed in the substrate 120, and enable the two opposite sides of the substrate 120 to be communicated with each other. The substrate 120 has a display area 121 and a marginal area 122 encircling the display area 121. The first via 123 is located in the marginal area 122. In some embodiments, the first via 123 is formed by utilizing a microlithography technology. In one embodiment, the first via 123 has an aperture of 5-10 microns, but the disclosure is not limited herein.

In the step 302, as shown in FIG. 1, the thin film transistor array 110 is formed on the substrate 120, covers the display area 121. The thin film transistor array 110 further comprises the plurality of display units 111 and the control circuit 112. The display units 111 are arranged at equal intervals, and are connected through the control circuit 112. A transverse row of the thin film transistor array 110 is aligned with the first via 123. In some embodiments, the thin film transistor array 110 is formed through chemical vapor deposition (CVD).

Each display unit 111 corresponds to at least one sub-pixel, such as a red sub-pixel, a green sub-pixel and a blue sub-pixel. Adjacent red sub-pixels, green sub-pixels and blue sub-pixels jointly form a pixel. For example, the display unit 111 comprises a thin film transistor, a pixel electrode and a storage capacitor, but the disclosure is not limited herein. A structure of the display unit 111 is not drawn in detail in the figure, and is only shown with square blocks. In addition, only six display units 111 are schematically drawn in FIG. 1. However, the thin film transistor array 110 comprises millions of display units 111 depending on resolution of the display device 100.

After the thin film transistor array 110 forms on the substrate 120, then in step 303, as shown in FIG. 1 and FIG. 2, the first via 123 is filled with the conductive filler 124, and the conductive filler 124 is electrically connected with the control circuit 112 of the thin film transistor array 110. A material of the conductive filler 124 comprises metal slurry or carbon nanotubes.

In step 303, filling the first via 123 is performed under a temperature less than or equal to a preset temperature. The preset temperature is lower than temperature in the deposition process of the thin film transistor array 110. In one embodiment, the preset temperature is 500° C. The method of manufacturing a display device 300 adopts a method of firstly performing deposition of the thin film transistor array 110 and then performing filling of the first via 123, so as to avoid that the via filler permeates into the thin film transistor.

In step 304, the backlight module 130 is arranged on one side of the substrate 120 away from the thin film transistor array 110, and is aligned with the display area 121 (referring to FIG. 1) of the substrate 120. In some embodiments, the backlight module 130 is a directly downward type backlight module.

In step 305, the control circuit board 140 is arranged on one side of the backlight module 130 away from the substrate. The flexible printed circuit 150 is used for coupling the control circuit board 140 to the first via 123. The flexible printed circuit 150 bypasses a side edge of the backlight module 130, one end of the flexible printed circuit 150 is connected with a bottom end of the first via 123, and is in electrical conduction with the conductive filler 124. The other end is electrically connected with the control circuit board 140. The control circuit board 140 is used for sending a control signal to the display unit 111, and in an embodiment as shown in FIG. 2, the control signal is sent to the display unit 111 sequentially through the flexible printed circuit 150, the conductive filler 124 and the control circuit 112.

Figure 4:
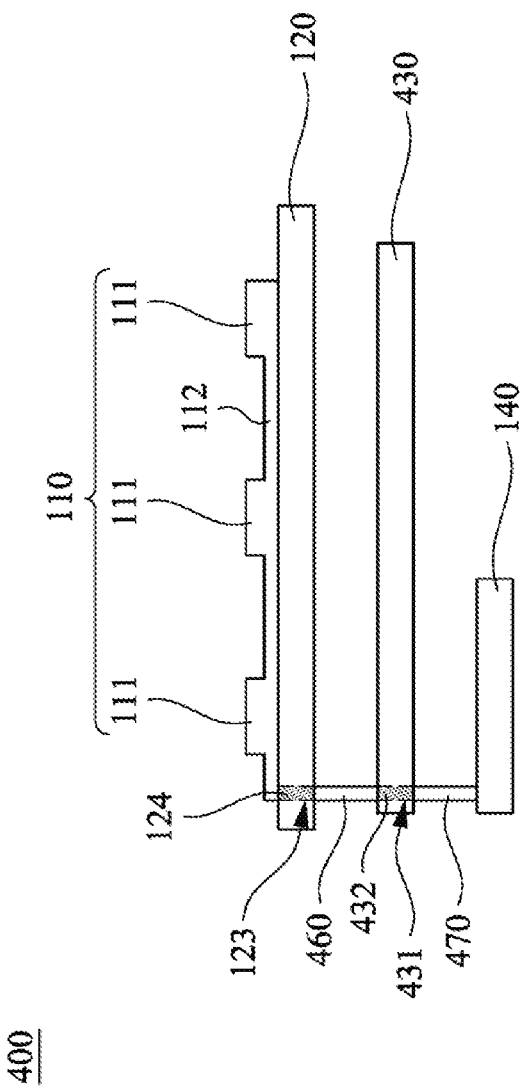
FIG. 4 is a perspective side view of a display device according to another embodiment of the disclosure.

Referring to FIG. 4, it is a perspective side view of a display device 400 according to another embodiment of the disclosure. The display device 400 comprises the thin film transistor array 110, the substrate 120, a backlight module 430, the control circuit board 140 and flexible printed circuits 460 and 470. The thin film transistor array 110, the substrate 120 and the control circuit board 140 are the same with the embodiment as shown in FIG. 2. Reference may be made to the foregoing relevant illustration, and the details are not repeated herein. A difference of the embodiment from the embodiment as shown in FIG. 2 lies in that the backlight module 430 of the display device 400 has a second via 431. The second via 431 enables two opposite sides of the backlight module 430 to be communicated with each other, and is aligned with the first via 123. The second via 431 is filled with a conductive filler 432. The conductive filler 432 comprises metal slurry or carbon nanotubes.

A top end of the second via 431 is coupled to the bottom end of the first via 123 through the flexible printed circuit 460, and the control circuit board 140 is coupled to a bottom end of the second via 431 through the flexible printed circuit 470. In the embodiment, the control signal sent by the control circuit board 140 is sent to the display unit 111 sequentially through the flexible printed circuit 470, the conductive filler 432, the flexible printed circuit 460, the conductive filler 124 and the control circuit 112.

Figure 5:
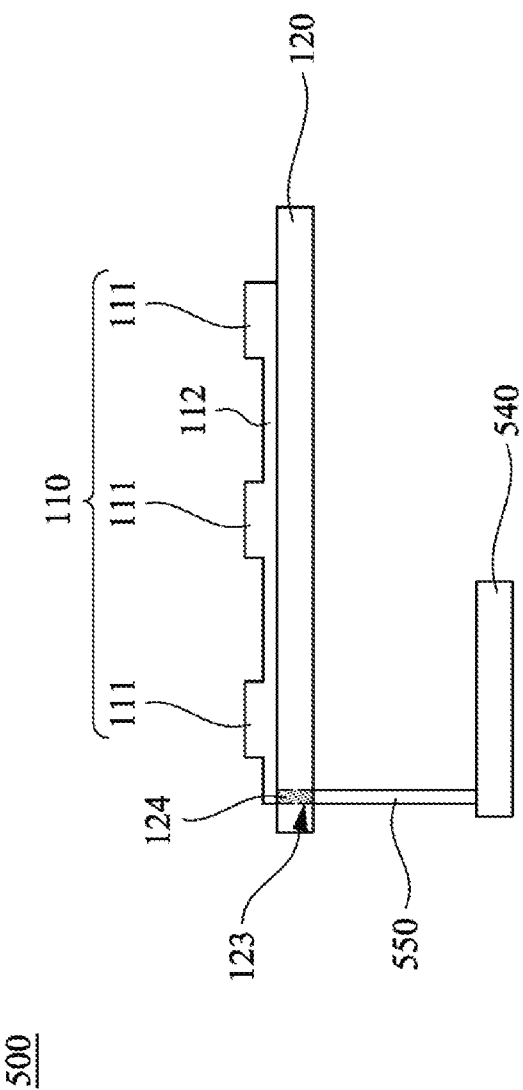
FIG. 5 is a side view of the display device according to another embodiment of the disclosure.

Referring to FIG. 5, it is a perspective side view of a display device 500 according to an embodiment of the disclosure. The display device 500 is a self-luminous display device, such as an organic light-emitting diode (OLED) display or a micro light-emitting diode (micro LED) display. In an embodiment, the OLED display emits light through an organic material (not shown) arranged above the thin film transistor, and therefore the backlight module is not needed. The display device 500 comprises the thin film transistor array 110, the substrate 120, a control circuit board 540 and a flexible printed circuit 550. A material of the substrate 120 comprises glass, a polymer material or other proper materials. In an embodiment, if the display device 500 is a bendable display device, and a polyimide (PI) substrate is used.

When the backlight module is not needed, the control circuit board 540 is directly arranged behind the substrate 120, and is connected with the bottom end of the first via 123 through the flexible printed circuit 550. It is to be understood that the practice of coupling the control circuit board 540 with the first via 123 through the flexible printed circuit 550 is only an example, and the disclosure is not limited herein. Those skilled in the art enables the control circuit board 540 to be connected with the first via 123 through other electrical connection means according to requirements in practice.

Figure 6:
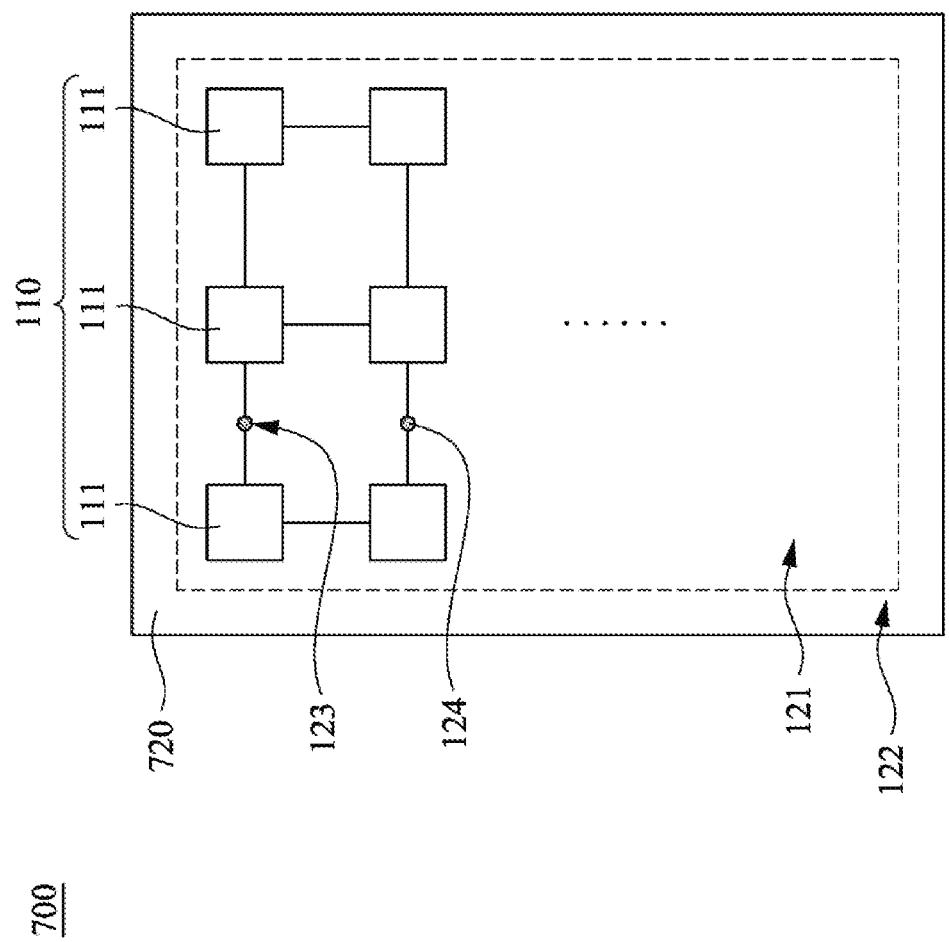
FIG. 6 is a top view of the display device according to another embodiment of the disclosure.
Figure 7:
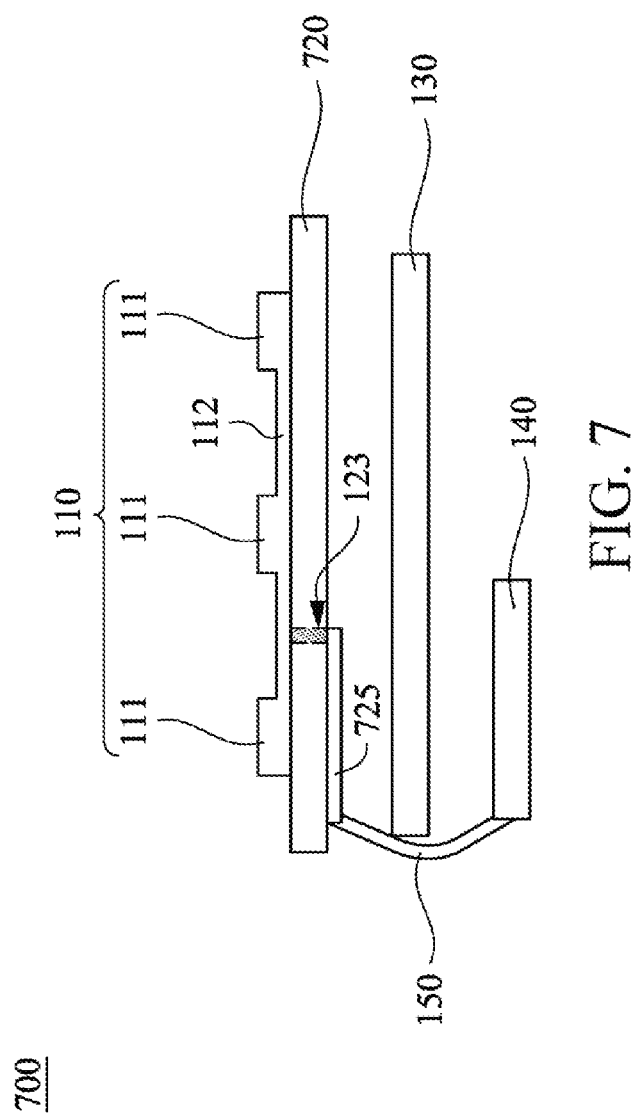
FIG. 7 is a side view of the display device as shown in FIG. 6.

Referring to FIG. 6 and FIG. 7, FIG. 6 is a top view of a display device 700 according to another embodiment of the disclosure, and FIG. 7 is a perspective side view of the display device 700 as shown in FIG. 6. As shown in FIG. 7, the display device 700 comprises the thin film transistor array 110, a substrate 720, the backlight module 130, the control circuit board 140 and the flexible printed circuit 150, wherein the thin film transistor array 110, the backlight module 130, the control circuit board 140 and the flexible printed circuit 150 are the same with the embodiment as shown in FIG. 2. Reference may be made to the foregoing relevant illustration, and the details are not repeated herein. Differences of the embodiment from the embodiments as shown in FIG. 1 and FIG. 2 lies in that the first via 123 of the substrate 720 of the embodiment is arranged in an area between the display units 111 of the thin film transistor array 110. In a light filtering layer (not shown) above the substrate 720, a position corresponding to the area between the display units 111 is provided with light resisting substances, to prevent light mixing between adjacent display units 111. Thus, the area between the display units 111 is used for arranging the vias or arranging a circuit.

Figure 8:
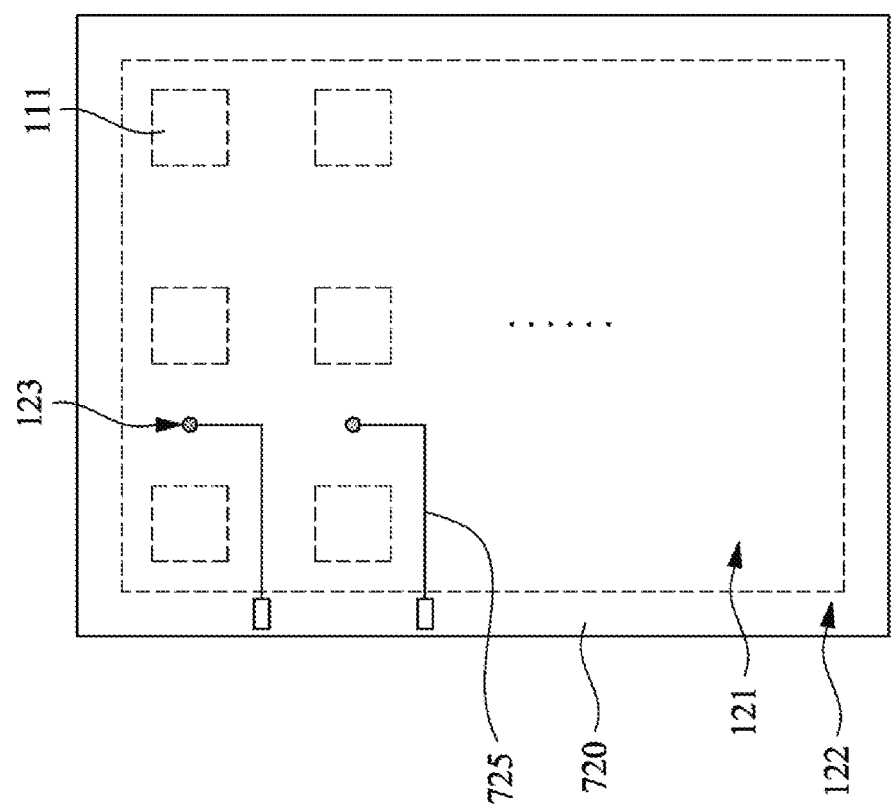
FIG. 8 is a bottom view of a substrate of the display device as shown in FIG. 6.

Referring to FIG. 8, it is a bottom view of the substrate 720 of the display device 700 as shown in FIG. 6. Due to the first via 123 is arranged in the display area 121, when connection of the control circuit board 140 is performed, connection with the bottom end of the first via 123 through the flexible printed circuit is not achieved. Thus, a surface of the substrate 720 away from the thin film transistor array 110 is provided with a connection circuit 725. The connection circuit 725 is connected with the bottom end of the first via 123, and extends to the marginal area 122 of the substrate 720. The connection circuit 725 is located in a wiring area, corresponding to the area between the display units 111, of a bottom surface of the substrate 720, so as not to affect content displayed by the display device 700.

With the above structural configuration, the control circuit board 140 is connected with the connection circuit 725 through the flexible printed circuit 150 at the marginal area 122. The control signal sent by the control circuit board 140 is sent to the display unit 111 sequentially through the flexible printed circuit 150, the connection circuit 725, the conductive filler 124 and the control circuit 112.

In some other embodiments, the display device 700 instead adopts a means as shown in FIG. 4, and the via is formed in the backlight module 130 to assist the control circuit board 140 in being connected to the first via 123 of the substrate 720.

It is to be understood that if the means by which the via is arranged between the display units is applied to the self-luminous display device 500 as shown in FIG. 5, and connection with the control circuit board 540 is performed, the flexible printed circuit 550 is connected with the bottom end of the first via of the substrate, and arrangement of the connection circuit on the bottom surface of the substrate is not essential.

In summary, the method of manufacturing a display device of the disclosure firstly performs deposition of the thin film transistor, and then performs filling of the vias in the low-temperature slurry filling manner, so as to avoid the problem that the via filler permeates into the thin film transistor.

Although the disclosure is described with reference to the above embodiments, the embodiments are not intended to limit the disclosure. Any person skilled in the art may make variations and improvements without departing from the spirit and scope of the disclosure. Therefore, the protection scope of the disclosure should be subject to the appended claims.

What is claimed is:

1. A method of manufacturing a display device, comprising:
    forming a thin film transistor array on a substrate at a first temperature, wherein the substrate has a first via which enable two opposite sides of the substrate to be communicated with each other; and
    filling the first via with a conductive filler at a second temperature after the thin film transistor array is formed, so that the conductive filler is electrically connected with the thin film transistor array, wherein the second temperature is lower than the first temperature.

2. The method of manufacturing a display device according to claim 1, wherein a material of the conductive filler contains at least one of metal slurry and carbon nanotubes.

3. The method of manufacturing a display device according to claim 1, wherein the substrate has a display area and an marginal area, the marginal area encircles the display area, and the first via is located in the marginal area.

4. The method of manufacturing a display device according to claim 1, wherein the thin film transistor array comprises a plurality of display units, and the first via is located between two adjacent display units in the display units.

5. The method of manufacturing a display device according to claim 4, further comprising:
    forming a connection circuit on one surface of the substrate away from the thin film transistor array, the connection circuit being connected with the first via,
    wherein the surface of the substrate away from the thin film transistor array has a wiring area corresponding to an area between the display units, and the connection circuit is partially located in the wiring area.

6. The method of manufacturing a display device according to claim 5, further comprising:
    coupling a control circuit board to the connection circuit.

7. The method of manufacturing a display device according to claim 1, further comprising:
    forming a second via in a backlight module, the second via enabling two opposite sides of the backlight module to be communicated with each other;
    filling the second via with another conductive filler; and
    coupling the first via to one end of the second via facing the substrate.

8. The method of manufacturing a display device according to claim 7, further comprising:
    coupling a control circuit board to the other end of the second via.

* * * * *